(12) United States Patent
Tsai et al.

(10) Patent No.: US 6,211,006 B1
(45) Date of Patent: Apr. 3, 2001

(54) METHOD OF FORMING A TRENCH-TYPE CAPACITOR

(75) Inventors: Hsin-Chuan Tsai; Yi-Nan Chen, both of Taipei; Pei-Ing Paul Lee, Taipei Hsien, all of (TW)

(73) Assignee: Nanya Technology Corporation (TW)

( * ) Notice: Subject to any disclaimer, the term of this patent is extended or adjusted under 35 U.S.C. 154(b) by 0 days.

(21) Appl. No.: 09/435,031

(22) Filed: Nov. 5, 1999

(30) Foreign Application Priority Data

Mar. 31, 1999  (TW) .............................. 088105100

(51) Int. Cl.$^7$ .................. H01L 21/8242; H01L 21/20

(52) U.S. Cl. .................. 438/246; 438/243; 438/247; 438/249; 438/386; 438/389; 438/390

(58) Field of Search .................. 438/243–249, 438/386–392

(56) References Cited

U.S. PATENT DOCUMENTS

| | | | |
|---|---|---|---|
| 4,999,312 | * | 3/1991 | Yoon ..................................... 437/52 |
| 5,395,786 | | 3/1995 | Hsu et al. .............................. 437/52 |
| 5,482,883 | * | 1/1996 | Rajeevakumar ....................... 437/52 |
| 5,658,816 | | 8/1997 | Rajeevakumar ..................... 438/386 |
| 6,008,103 | * | 12/1999 | Hoepfner ............................. 438/386 |

OTHER PUBLICATIONS

A 0.6 $\mu m^2$ Trench DRAM Cell With Self–Aligned BuriEd STrap (BEST), L. Nesbit et al., 1993, IEDM, pp. 627–630.

* cited by examiner

*Primary Examiner*—John F. Niebling
*Assistant Examiner*—Jennifer M. Kennedy
(74) *Attorney, Agent, or Firm*—George T. Marcou; Kilpatrick Stockton LLP (57) ABSTRACT

The present invention relates to a method of forming a trench-type capacitor. More particularly, the plate areas of the trench-type capacitor are increased according to the present invention. The method of this invention comprises the steps of: providing a semiconductor substrate; forming a first trench in the semiconductor substrate, wherein the first trench has a first predetermined depth in the semiconductor substrate; forming first spacers on the side-walls of the first trench, wherein the first spacers include second spacers formed at the bottom of the first trench and third spacers exposed to the air; forming a second trench by aligning the semiconductor substrate with masks of the first spacers and etching the semiconductor substrate to a second predetermined depth; forming a first conducting layer by doping ions into the semiconductor substrate in the second trench; forming an oxide layer on the surface of the first conducting layer by oxidation, wherein the thickness of the oxide layer is less than that of the first conducting layer; forming a second conducting layer by removing the oxide layer, removing the first spacers; forming a dielectric layer upon the second conducting layer; and forming a third conducting layer upon the dielectric layer.

12 Claims, 11 Drawing Sheets

METHOD OF FORMING A TRENCH-TYPE CAPACITOR

BACKGROUND OF THE INVENTION

1. Field of the Invention

The present invention relates to a method of fabricating a capacitor, and more particularly to a method of forming a trench-type capacitor in a dynamic random access (DRAM).

2. Description of the Related Art

Figure 1:
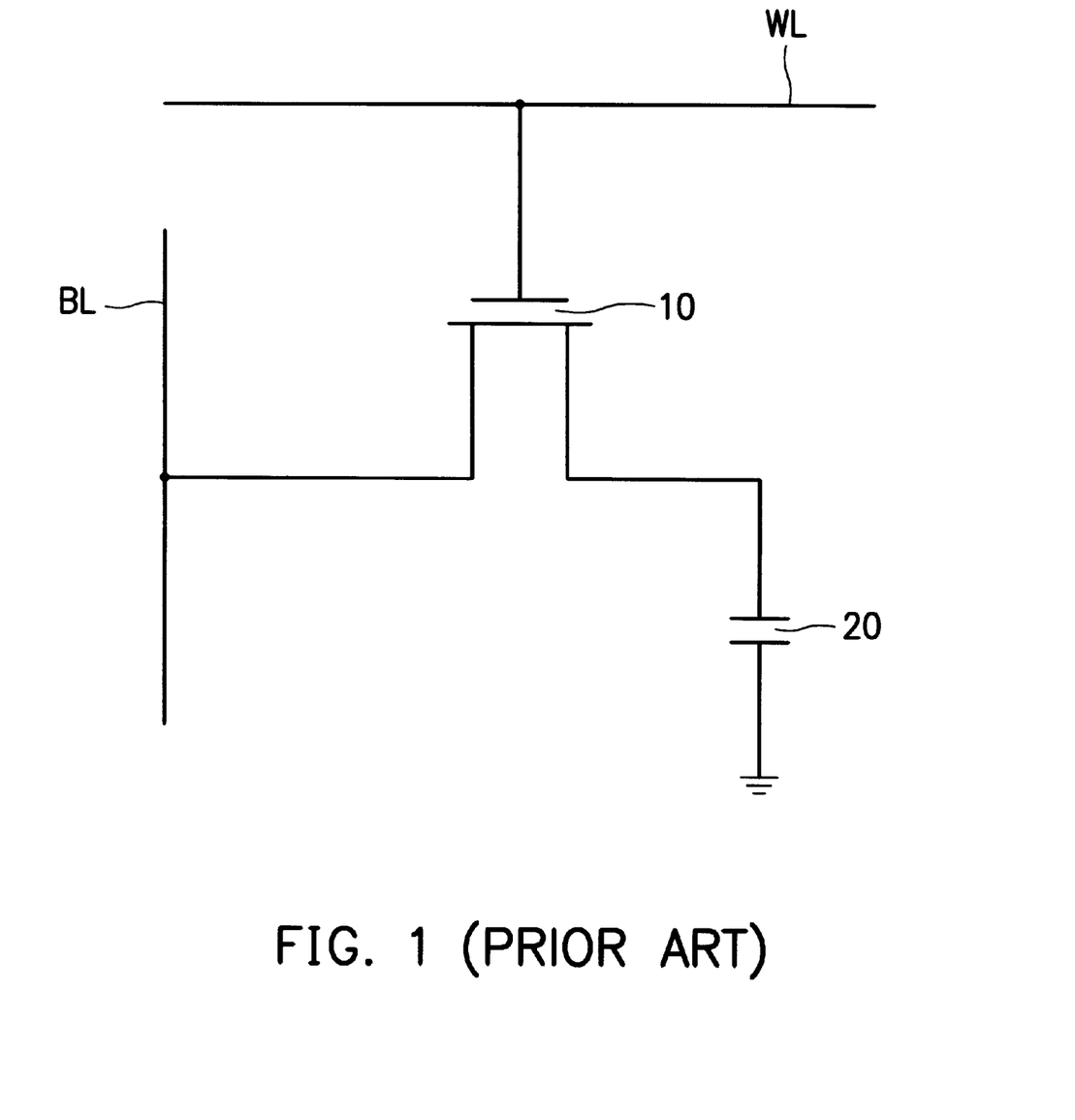
FIG. 1 shows the circuit of a dynamic random access memory cell.

Integrated circuits (IC) are widely used in semiconductor industry. All kinds of semiconductor devices are produced according to different objects. These devices have high efficiency and lower cost. For example, DRAM devices are important in the electronic industry. A DRAM cell is composed of a transistor and a capacitor. In FIG. 1, the arrangement of a DRAM cell is shown. The drain of the NMOS transistor 10 is connected to a storage plate of a capacitor 20. The gate of the NMOS transistor 10 is connected to a word line WL. The source of the NMOS transistor 10 is connected to a bit line BL. Additionally, an opposed plate of the capacitor 20 is connected to a power source. Further, a dielectric layer is disposed between the storage plate and the opposed plate. The capacitor stores or releases charges according to the ON or OFF state of the NMOS transistor. Thus, the logic memory of a memory cell is performed.

A planar-type capacitor is used in the fabrication of a DRAM whose memory capacity is below 1MB. As the arrangement of the capacitor is two dimensional, the area of the plate distributed in the substrate is large so as to provide enough memory capacity. However, as sizes of devices are decreased, the size of the DRAM device is minimized also. In the planar-type capacitor, minimizing the distributing area of the plates will decrease the capacitance of the capacitor.

To solve the problems described above, a capacitor with three dimensions has been proposed. For example, a trench-type capacitor or a stacked-type capacitor is well known in the field. The trench-type capacitor and the related arts is disclosed in U.S patent application Ser. No. 5,395,786, No. 5,658,816, and a paper entitled "A 0.6 $\mu$m 256 Mb Trench DRAM Cell With Self-aligned BuriEd Strap (BEST)" published in 1993 IEDM p. 627~P. 630 by L. Nesbit, et al. This type of capacitors has increased capacitance but takes a smaller area of the substrate. In the processes of forming a trench-type capacitor, an insulating layer (for example, oxide/nitride or oxide/nitride/oxide) and a conducting layer (for example, a polysilicon layer doped with $N^+$ ions) are deposited and etched to form the structure of the trench-type capacitor. In the normal processes, a mask is formed utilizing photoresist on substrate. Utilizing photolithography, a trench is subsequently formed. Then a plate and a dielectric layer are successively formed in the trench. Thereupon, the trench is filled with a conducting material, and then a trench-type capacitor is formed.

Figure 2A:
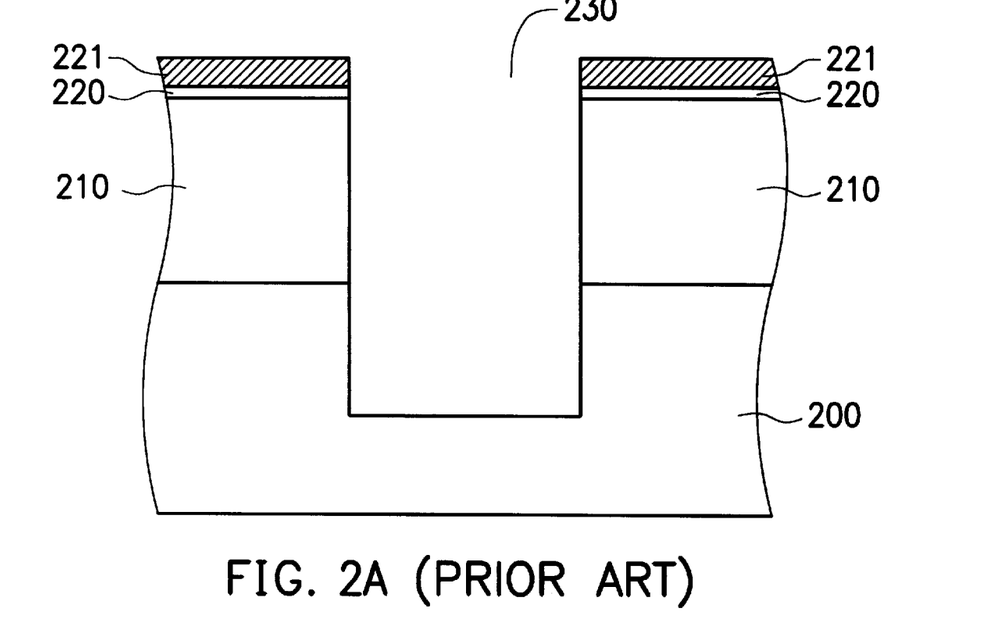
FIGS. 2A~2F show the conventional method of forming a trench-type capacitor.

FIG. 2A~FIG. 2F show the processes of forming a trench-type capacitor in a substrate as described in the paper entitled "A 0.6 $\mu$m 256 Mb Trench DRAM Cell With Self-aligned BuriEd Strap (BEST)" published in 1993 IEDM p. 627~P. 630 by L. Nesbit, et al. As shown in FIG.2A, an epitaxy layer 210 is formed on the P⁻-type substrate 200. Subsequently, a silicon oxide layer 220 and a silicon nitride layer 221 are formed on the epitaxy layer 210. Then a first trench 230 is formed by utilizing photolithography and etching technologies, wherein the bottom of the trench 230 is in the P⁻-type substrate 200.

Figure 2B:
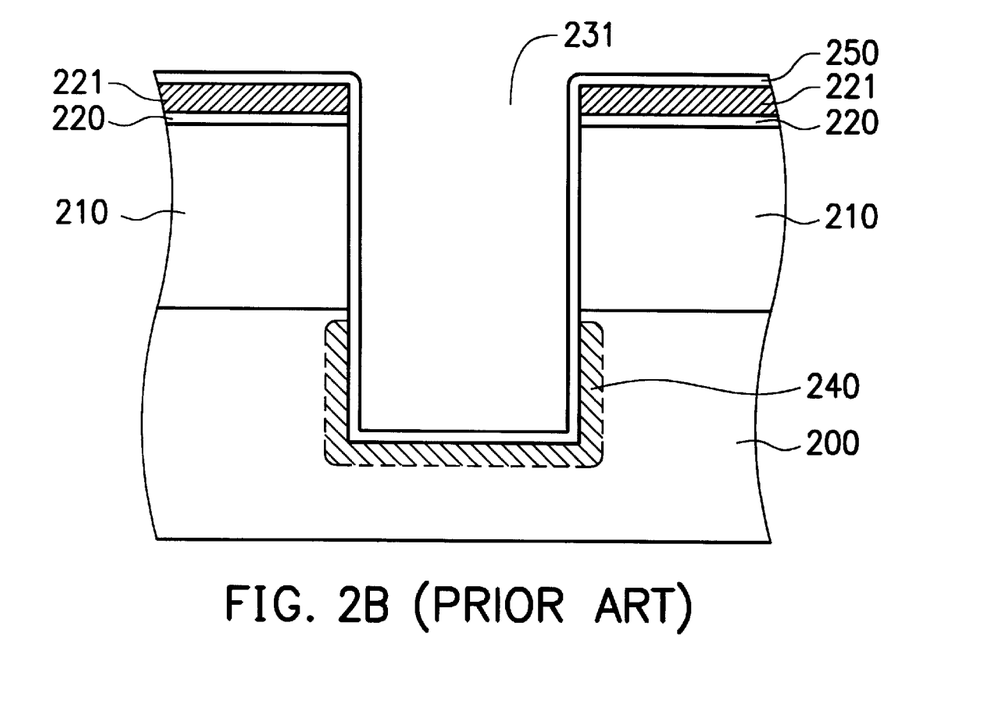

Referring to FIG. 2B, in order to form a storage plate 240, arsenic ions are driven into the bottom and the sidewalls of the trench 230 in the P⁻-type substrate 200 according to ion diffusion. The storage plate 240 is to be a plate of the trench-type capacitor formed thereafter. Then silicon oxide and silicon nitride (ON) are subsequently deposited in the bottom and the sidewalls of the trench 230 to form a dielectric layer 250. Thus, a second trench 231 is formed.

Figure 2C:
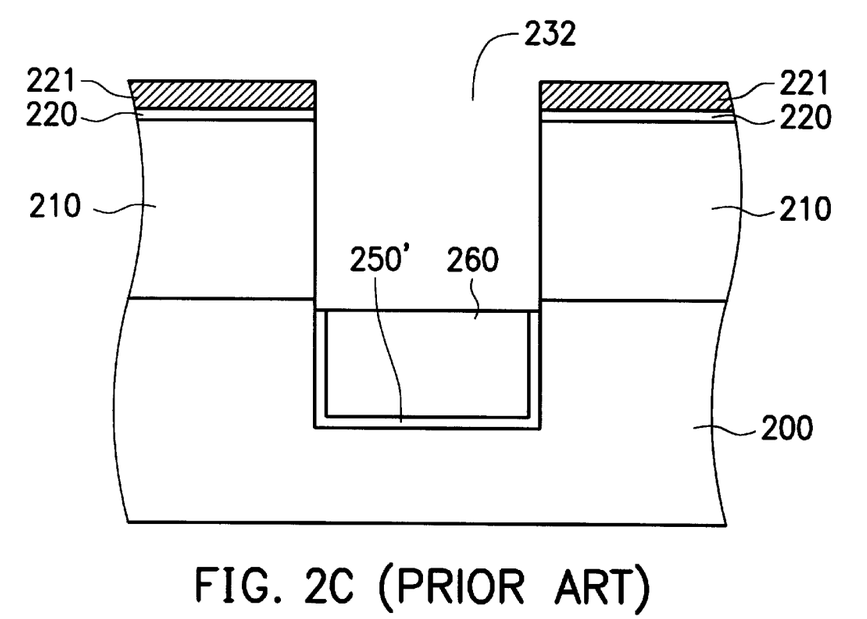

Referring to FIG. 2C, polysilicon doped with arsenic ions $N^+$ is filled in the second trench 231. After a planarization process, a first conducting layer 260 is formed. Then the dielectric layer 250 exposed in the air is etched to form a dielectric layer 250' between the two plates of the trench-type capacitor formed thereafter. A third trench 232 is formed herein.

Figure 2D:
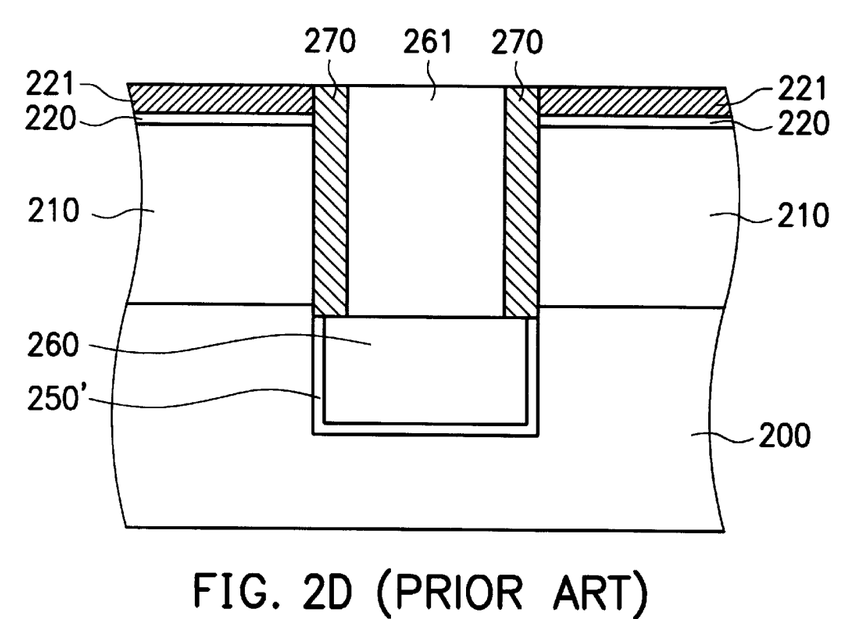

As shown in FIG. 2D, a collar isolation layer 270 and a second conducting layer 261 are formed in the trench 232. The material of the collar isolation layer 270 is silicon oxide in order to prevent leakage. The second conducting layer 261 is made of polysilicon doped with arsenic ions $N^+$.

Figure 2E:
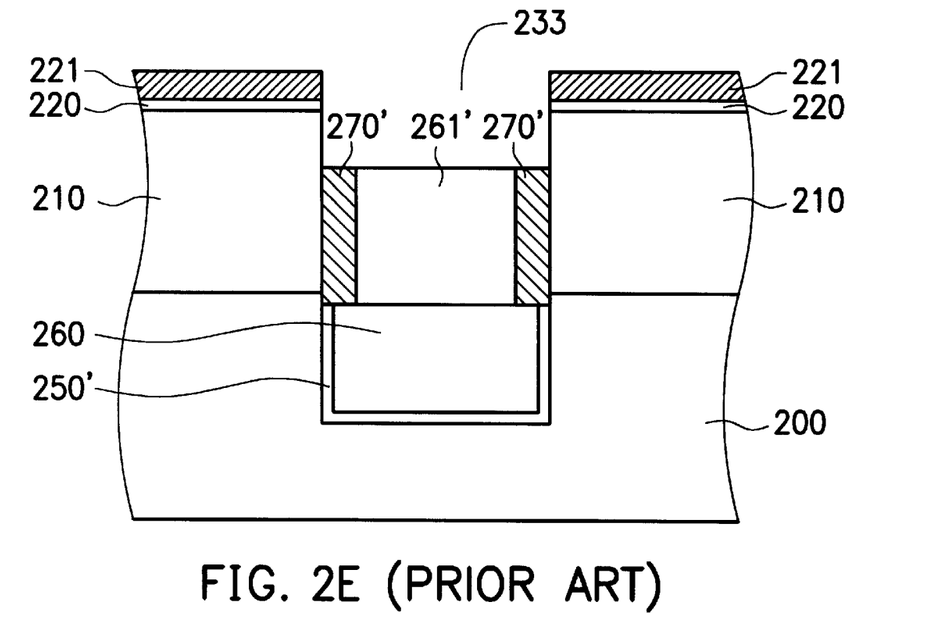

Referring to FIG. 2E, the collar isolation layer 270 and the second conducting layer 261 are selectively etched to form a collar isolation layer 270' and a second conducting layer 261'. It is noted that two materials are etched in the step, so it is necessary to set appropriate etching depths twice so that a fourth trench 233 is formed.

Figure 2F:
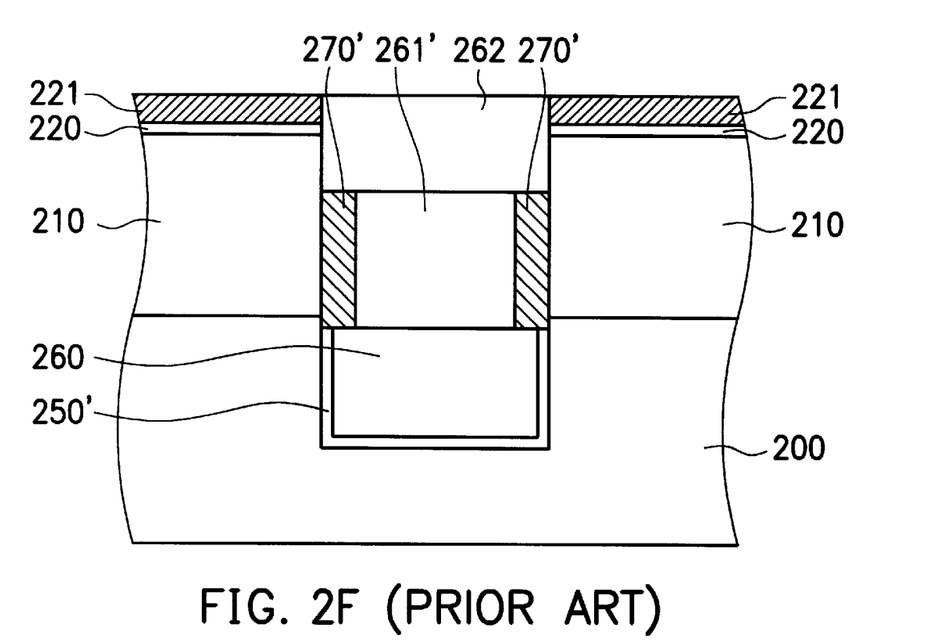

As shown in FIG. 2F, polysilicon doped with arsenic ions $N^+$ is deposited in the fourth trench 233 to form a third conducting layer 262. A trench-type capacitor is then completed herein.

However, devices with high integration in a substrate are highly developed in the semiconductor industry. Take a DRAM for example. In order to obtain better-integrated memory, a large number of memory cells must be fit in a memory circuit; thus, the base area of a memory cell must be minimized. It is well known that the capacitance of a capacitor is in proportion to the area of the plate. Thus, the amounts of charges that the capacitor can store are decreased.

SUMMARY OF THE INVENTION

Therefore, the primary object of the invention is to provide a method of forming a trench-type capacitor, wherein the area of the plate in the trench-type capacitor is increased, and the capacitance of the capacitor is increased also. Furthermore, the above devices can be integrated in the substrate.

In order to attain the object described above, the present invention provides a method of forming a trench-type capacitor, comprising the following steps: providing a semiconductor substrate; forming a first trench in the semiconductor substrate, wherein the first trench has a first predetermined depth in the semiconductor substrate; forming first spacers on the side-walls of the first trench, wherein the first spacers include second spacers formed at the bottom of the first trench and third spacers exposed to the air; forming a second trench by aligning the semiconductor substrate with masks of the first spacers and etching the semiconductor substrate to a second predetermined depth; forming a first conducting layer by doping ions into the semiconductor substrate in the second trench; forming an oxide layer on the surface of the first conducting layer by oxidation, wherein the thickness of the oxide layer is less than that of the first conducting layer; forming a second conducting layer by removing the oxide layer, removing the first spacers; forming a dielectric layer upon the second conducting layer; and forming a third conducting layer upon the dielectric layer.

BRIEF DESCRIPTION OF THE DRAWINGS

These and other features of the present invention will now be described in detail with reference to the accompany drawings, in which.

DETAILED DESCRIPTION OF THE PREFERRED EMBODIMENT

In semiconductor processes, the charging capacitance of a trench-type capacitor is normally determined after the processes of patterning and etching. In other words, the size of the trench-type capacitor and the depth of etching determine the plate areas of the trench-type capacitor. An object of the present invention is to enlarge the plate areas without changing the size of the trench-type capacitor or the depth of etching.

Figure 3A:
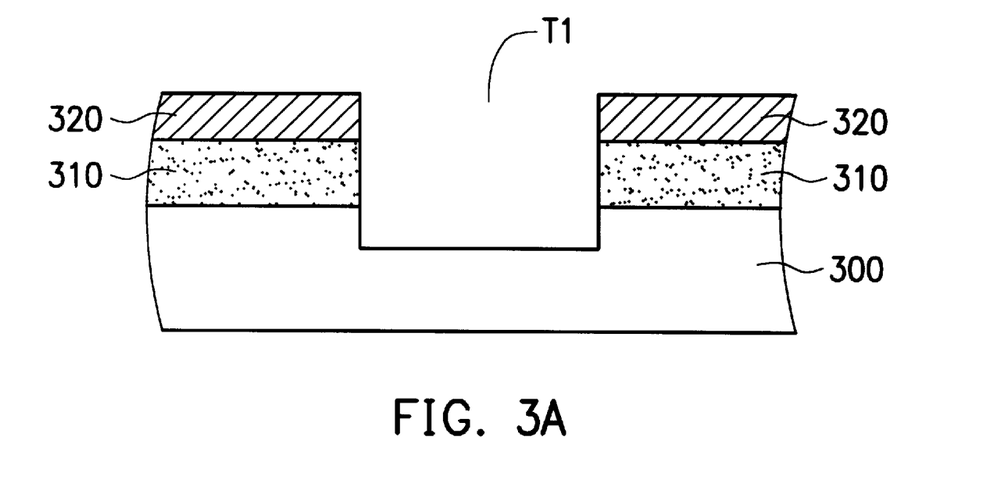
FIGS. 3A~3J show the method of forming a trench-type capacitor according to the present invention.

As shown in FIG. 3A, a semiconductor substrate 300 (for example, a silicon substrate) is provided. A masking layer such as a silicon oxide layer 310 and a silicon nitride layer 320 are subsequently formed on the semiconductor substrate 300. Then, a trench T1 is formed by photolithography and etching processes. Further, the bottom of the trench T1 is in the semiconductor substrate 300.

Figure 3B:
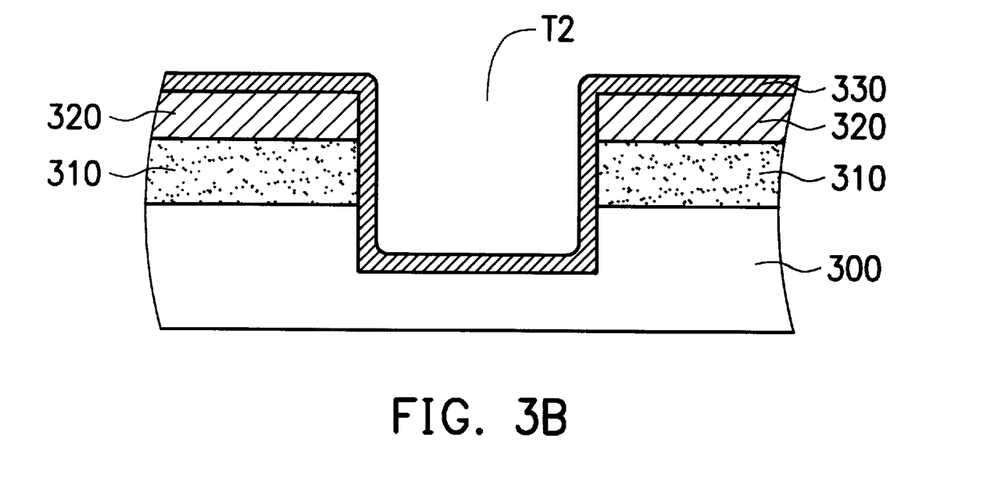
Figure 3C:
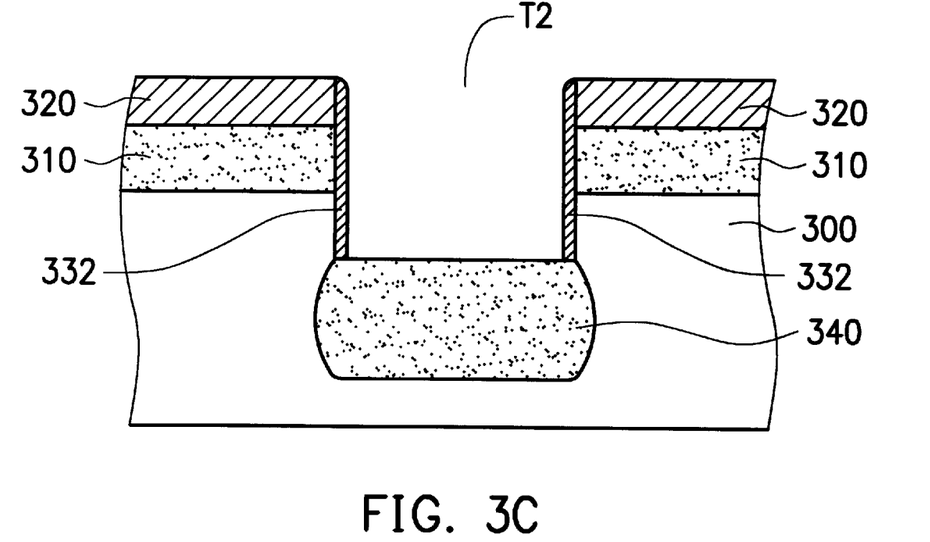
Figure 3D:
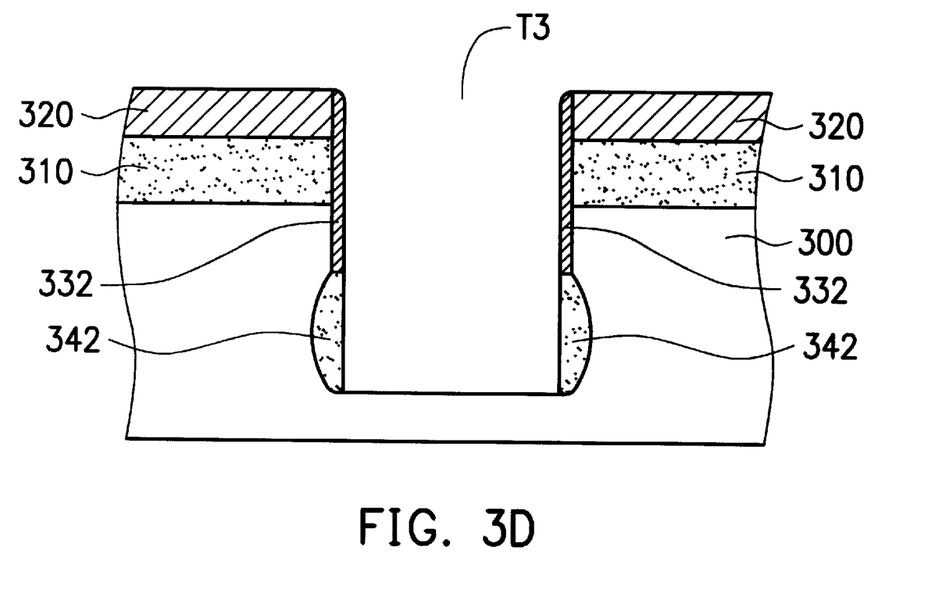

As shown in FIG. 3B, a dielectric layer 330 (for example, a silicon nitride layer) is deposited by low-pressure chemical vapor deposition or high-density plasma chemical vapor deposition. A trench T2 is therefore formed. Referring to FIG. 3C, silicon nitride spacers 332 are formed utilizing an etching back process. Thereafter, isolating spacers, such as silicon oxide spacers, are formed to prevent leakage. As shown in FIG. 3C, the silicon oxide layer 340 is formed by dry oxidation or wet oxidation. Referring to FIG. 3D, the silicon oxide spacers 342 are formed by etching the silicon oxide layer 340 anisotropically with the silicon nitride layer 320 and the silicon nitride spacers 332 as masks. Thus, the isolating spacers in the trench-type capacitor are formed.

Figure 3E:
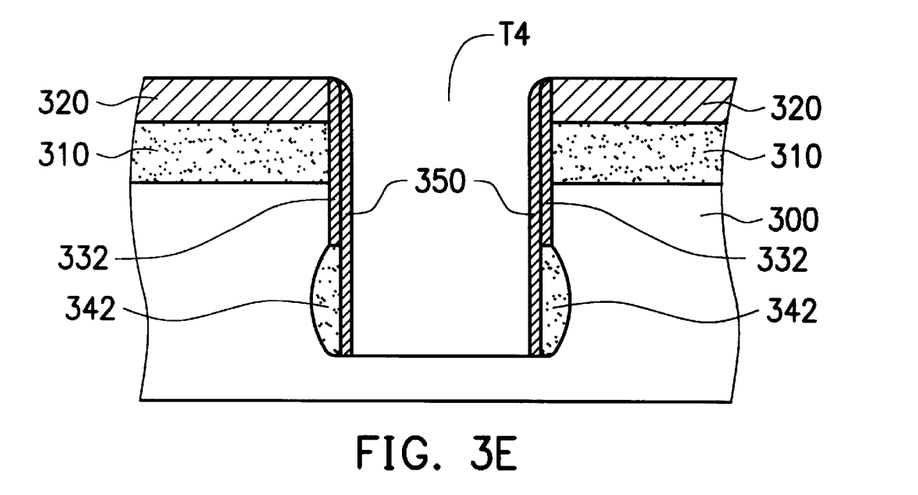

In order to protect the silicon oxide spacers 342 from impurity during the steps of doping and driving-in so that their crystalline structure isn't changed, the silicon nitride spacers 350 are provided as shown in FIG. 3E. Thus, the isolating effect is good. The silicon nitride spacers 350 are formed by depositing the silicon nitride layer on the surface of the silicon substrate 300 and filling the trench T3. Thereafter, the etching back process is utilized so that the silicon nitride spacers 350 are formed as shown in FIG. 3E.

Figure 3F:
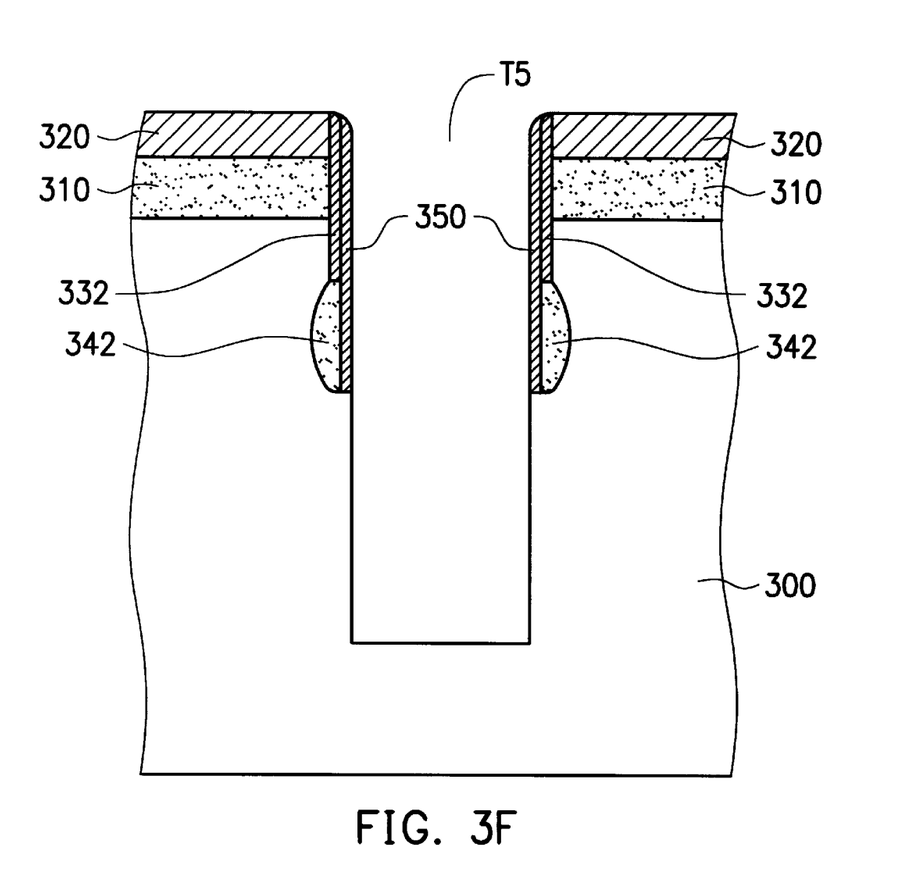

FIG. 3F shows the result of etching the silicon substrate 300. Another trench T5 is thereby formed. It is noted that the trench T5 is limited by the practicality of processes. However, according to the methods of the invention, the capacitance of the trench-type capacitor is increased without increasing the depth of the trench-type capacitor.

Figure 3G:
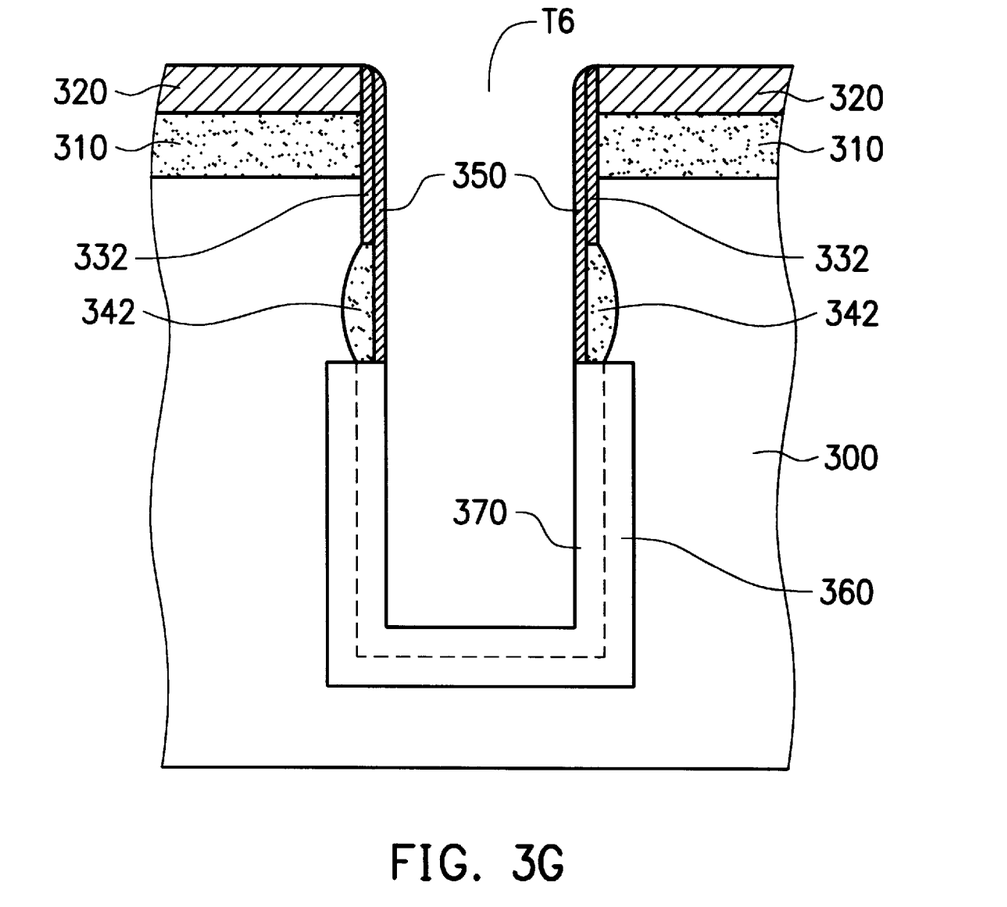

FIG. 3G shows the steps of doping and driving-in. The bottom plate is formed by doping with ions. In the embodiment, the silicon substrate 300 is doped with ions such as arsenic ions or phosphor ions by diffusion or ion implantation. Thereby, the N-type doping area 360 is formed.

Subsequently, a silicon oxide layer 370 is formed above the N-type doping area 360 by dry oxidation. Because the oxidation rate in the step is controlled, the width of the silicon oxide layer is controlled also. In other words, the capacitance of the trench-type capacitor is therefore controlled. That is, the object of the invention is achieved by increasing the N-type doping area 360, i.e., the surface of the silicon oxide layer 370.

Figure 3H:
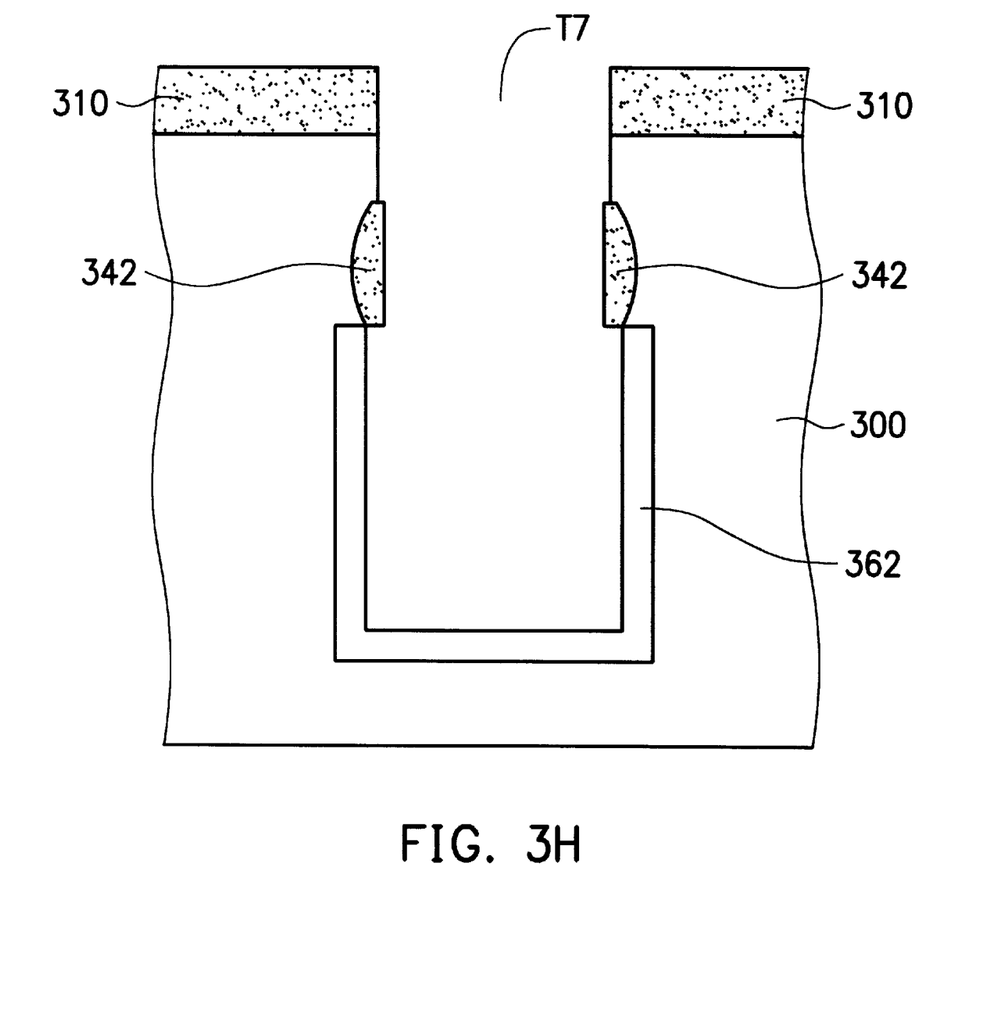

FIG. 3H shows the step of removing the silicon oxide layer 370, wherein a trench T7 is thereby formed. The silicon oxide layer 370 is removed by vapor phase hydrogen fluoride or dilute hydrogen fluoride. In this step, the effect of the vapor phase hydrogen fluoride in removing the silicon oxide layer 370 is better than that of dilute hydrogen fluoride. Thus, the N-type doping area 362 can be increased by utilizing the vapor phase hydrogen fluoride with the adjustable oxidation rate.

Figure 3I:
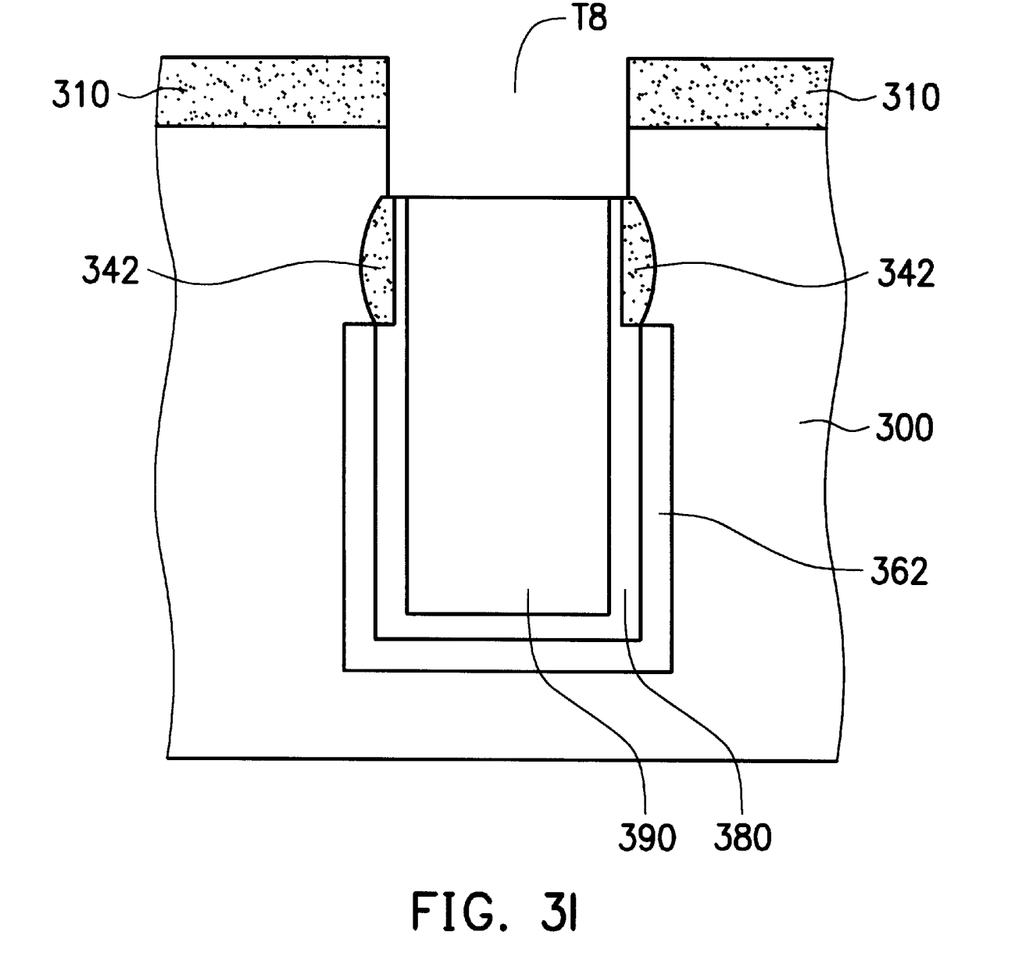

Thereafter, a dielectric layer 380 such as an ON (oxide/nitride) layer or an ONO (oxide/nitride/oxide) layer is formed in the trench T7. In addition, a portion of an upper plate 390 (for example, a polysilicon layer doped with arsenic ions) is formed, and a trench T8 is thereby formed.

Figure 3J:
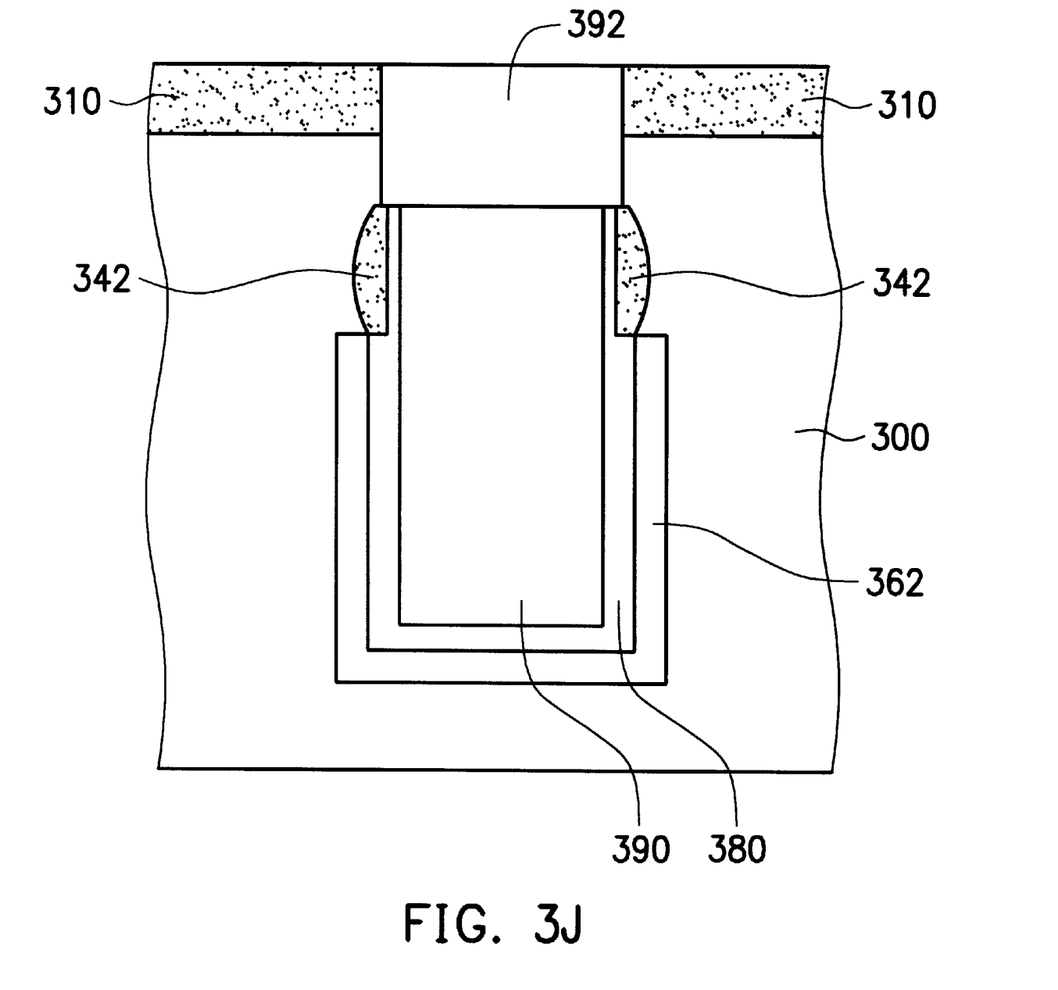

As shown in FIG. 3J, polysilicon doped with ions is deposited on the silicon oxide layer 310 and fills in the trench T8. Subsequently, the other portion of the upper plate 392 is formed by removing the polysilicon on the surface of the silicon oxide layer 310 with a CMP (chemical mechanical polishing) process.

Compared with the prior art, which etches the substrate vertically so that the area of the capacitor is fixed, the present invention provides the advantages of increasing the area of the plate and increasing the integration of the semiconductor that the trench-type capacitor is formed.

While the present invention has been described and illustrated herein with reference to the preferred embodiment thereof, it will be understood by those skilled in the art that various changes in the form and details may be made without departing from the spirit and the scope of the invention.

What is claimed is:

1. A method of forming a trench-type capacitor, comprising:

(a) providing a semiconductor substrate that has a shielding layer positioned on the surface of the semiconductor substrate and a first trench penetrating an area of the shielding layer and the semiconductor substrate of a first depth;

(b) forming a first spacer on the sidewall of the first trench;

(c) performing an oxidation process on the exposed semiconductor substrate in the first trench to form a first oxide layer of a second depth;

(d) performing an etching process to remove the first oxide layer of the second depth not covered by the first spacer so as to form a second trench, wherein the remaining first oxide layer underlying the first spacer and surrounding the bottom sidewall of the second trench serves as a second spacer;

(e) forming a third spacer on the sidewall of the second trench to cover the first spacer and the second spacer;

(f) removing the exposed semiconductor substrate of a third depth in the second trench so as to form a third trench;

(g) doping ions into the exposed semiconductor substrate in the third trench so as to form a first conducting layer surrounding the bottom of the third trench;

(h) performing an oxidation process to form a second oxide layer on the first conducting layer, wherein the thickness of the second oxide layer is smaller than the thickness of the first conducting layer;

(i) removing the second oxide layer;

(j) forming a dielectric layer on the first conducting layer; and (k) forming a second conducting layer on the dielectric layer.

2. The method as claimed in claim 1, wherein the shielding layer is made of silicon nitride.

3. The method as claimed in claim 1, wherein the first spacer is made of silicon nitride.

4. The method as claimed in claim 1, wherein the second spacer is made of silicon oxide.

5. The method as claimed in claim 1, wherein the third spacer is made of silicon nitride.

6. The method as claimed in claim 1, wherein the step (g) dopes arsenic ions into the exposed semiconductor substrate in the third trench.

7. The method as claimed in claim 1, wherein the step (g) dopes phosphor ions into the exposed semiconductor substrate in the third trench.

8. The method as claimed in claim 1, wherein the step (g) uses a diffusion method to dope ions into the exposed semiconductor substrate in the third trench.

9. The method as claimed in claim 1, wherein the step (g) uses an ion implantation method to dope ions into the exposed semiconductor substrate in the third trench.

10. The method as claimed in claim 1, wherein after doping ions into the exposed semiconductor substrate, the ions are thermally driven into the semiconductor substrate.

11. The method as claimed in claim 1, wherein the step (i) uses vapor phase hydrogen fluoride to selectively remove the second oxide layer.

12. The method as claimed in claim 1, wherein the step (i) uses dilute hydrogen fluoride to selectively remove the second oxide layer.

* * * * *